US012578644B2

(12) United States Patent
Mizuochi et al.

(10) Patent No.: US 12,578,644 B2
(45) Date of Patent: Mar. 17, 2026

(54) UPPER FILM-FORMING COMPOSITION AND METHOD FOR PRODUCING PHASE-SEPARATED PATTERN

(71) Applicant: NISSAN CHEMICAL CORPORATION, Tokyo (JP)

(72) Inventors: Ryuta Mizuochi, Toyama (JP); Sho Shimizu, Toyama (JP); Mamoru Tamura, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 579 days.

(21) Appl. No.: 18/007,910

(22) PCT Filed: Jun. 4, 2021

(86) PCT No.: PCT/JP2021/021393
§ 371 (c)(1),
(2) Date: Dec. 2, 2022

(87) PCT Pub. No.: WO2021/251295
PCT Pub. Date: Dec. 16, 2021

(65) Prior Publication Data

US 2023/0280654 A1 Sep. 7, 2023

(30) Foreign Application Priority Data

Jun. 8, 2020 (JP) ................................ 2020-099356

(51) Int. Cl.
*G03F 7/11* (2006.01)
*H01L 21/02* (2006.01)
(Continued)

(52) U.S. Cl.
CPC .......... *G03F 7/11* (2013.01); *H01L 21/02118* (2013.01); *H01L 21/3065* (2013.01);
(Continued)

(58) Field of Classification Search
CPC .... G03F 7/11; G03F 7/0002; H01L 21/02118; H01L 21/3065; H01L 21/3081;
(Continued)

(56) References Cited

U.S. PATENT DOCUMENTS 10,865,262 B2 * 12/2020 Mizuochi ............ C09D 179/08
2013/0344242 A1 12/2013 Willson et al.
(Continued)

FOREIGN PATENT DOCUMENTS

JP H03-37257 A 2/1991
JP H06-87932 A 3/1994
(Continued)

OTHER PUBLICATIONS

Dec. 13, 2022 International Preliminary Report Issued in International Patent Application No. PCT/JP2021/021393.
(Continued)

*Primary Examiner* — Caleen O Sullivan
(74) *Attorney, Agent, or Firm* — Oliff PLC

(57) ABSTRACT

An upper layer film-forming composition exhibits good solubility in hydrophobic solvents and can bring about vertical alignment of a block copolymer without dissolution, swelling or the like of a layer containing the block copolymer formed on a substrate. This upper layer film-forming composition is used for phase separation of a layer containing a block copolymer formed on a substrate, and contains: (A) a copolymer containing a unit structure derived from a maleimide structure (a) and a unit structure derived from a styrene structure; and (B) as a solvent, a non-aromatic hydrocarbon compound that is a liquid at normal temperature and pressure.

14 Claims, 1 Drawing Sheet

(51) Int. Cl.
*H01L 21/3065* (2006.01)
*H01L 21/308* (2006.01)
*H01L 21/311* (2006.01)

(52) U.S. Cl.
CPC ...... *H01L 21/3081* (2013.01); *H01L 21/3086* (2013.01); *H01L 21/31138* (2013.01); *H01L 21/31144* (2013.01)

(58) Field of Classification Search
CPC ........... H01L 21/3086; H01L 21/31138; H01L 21/31144; H01L 21/0271; H01L 21/31; C09D 135/00; C09D 153/00; C08F 212/14; C08F 212/08; C08F 220/10; C08F 222/40; C08F 222/402; C08F 212/12; C08F 220/1803; C08F 220/1806; C08F 220/1818; C08F 220/1804; C08F 220/1812; C08L 35/06
USPC ................................................ 430/270.1, 311
See application file for complete search history.

(56) References Cited

U.S. PATENT DOCUMENTS

| | | | |
|---|---|---|---|
| 2016/0124309 | A1 | 5/2016 | Lee et al. |
| 2019/0204742 | A1 | 7/2019 | Lee et al. |
| 2019/0233559 | A1 | 8/2019 | Mizuochi et al. |
| 2020/0247934 | A1 | 8/2020 | Kitamura et al. |
| 2021/0284782 | A1 | 9/2021 | Mizuochi et al. |

FOREIGN PATENT DOCUMENTS

| | | | |
|---|---|---|---|
| JP | H7-278232 | A | 10/1995 |
| JP | 2015-5750 | A | 1/2015 |
| KR | 2019-0054090 | A | 5/2019 |
| KR | 2019-0093540 | A | 8/2019 |
| WO | 2017/188031 | A1 | 11/2017 |
| WO | 2018/051907 | A1 | 3/2018 |
| WO | 2020/017494 | A1 | 1/2020 |

OTHER PUBLICATIONS

Aug. 24, 2021 International Search Report Issued in International Patent Application No. PCT/JP2021/021393.

Oct. 15, 2025 Office Action issuesd in Korean Patent Application No. 10-2022-7045227 (with translation).

* cited by examiner

UPPER FILM-FORMING COMPOSITION AND METHOD FOR PRODUCING PHASE-SEPARATED PATTERN

TECHNICAL FIELD

The present invention relates to an upper film-forming composition and a method for producing a phase-separated pattern.

BACKGROUND ART

In the technique of inducing phase-separation of a block copolymer layer formed on a substrate such as a semiconductor substrate, removing portions of the block copolymer, and subsequently subjecting the substrate, it is a well known practice to provide an upper film on the block copolymer layer to obtain a desired lithographic pattern in a controlled manner by treatment such as thermal annealing (Patent Literature 1). Although the conventional upper films are quickly dissolved in hydrophilic solvents such as water, methanol and isopropanol, they do not show a high solubility in hydrophobic solvents. A known approach to achieving high solubility in a hydrophobic solvent is to use an ether solvent such as diisoamyl ether (Patent Literature 2). On the other hand, a further densification of lithographic patterns has been required in recent years, and there has been raised a concern that block copolymers satisfying such requirement are dissolved in an ether solvents, such as diisoamyl ether, even if they are hydrophobic solvents.

CITATION LIST

Patent Literature

Patent Literature 1: JP 2015-5750 A

Patent Literature 2: WO 2018/519707051907

SUMMARY OF INVENTION

Technical Problem

Thus, awaited is the development of an upper film-forming composition, which provides an upper film that allows for vertical alignment of a block copolymer on a substrate without causing dissolution or swelling of the layer containing the block copolymer and exhibits a good solubility to a hydrophobic solvent.

Solution to Problem

The present invention embraces the following.

[1] An upper film-forming composition comprising:

(A) a copolymer comprising (a) a unit structure derived from a maleimide structure and a unit structure derived from a styrene structure; and (B) a non-aromatic hydrocarbon compound that is liquid at room temperature and atmospheric pressure, as a solvent, wherein the upper film-forming composition is used to induce phase-separation of a layer comprising a block copolymer on a substrate.

[2] The upper film-forming composition according to [1], wherein the solvent is a C4-C26 non-aromatic hydrocarbon compound.

[3] The upper film-forming composition according to [1] or [2], wherein the solvent is a non-cyclic hydrocarbon compound or a cyclic hydrocarbon compound.

[4] The upper film-forming composition according to [3], wherein the non-cyclic hydrocarbon compound is a saturated linear, unsaturated linear, saturated branched, or unsaturated branched hydrocarbon compound.

[5] The upper film-forming composition according to [3], wherein the cyclic hydrocarbon compound is a substituted monocyclic compound, or an optionally substituted, bicyclic or fused-ring compound.

[6] The upper film-forming composition according to [3], wherein the cyclic hydrocarbon compound is a C6-C19 cyclic hydrocarbon compound.

[7] The composition according to any one of [1] to [6], wherein the unit structure derived from a maleimide structure is represented by formula (1):

[Chem. 1]

formula (1)

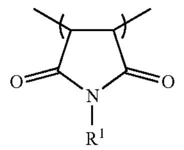

(in formula (1), $R^1$ denotes a hydrogen atom, a C1-C10 linear, branched or cyclic alkyl group, or a C6-C10 aryl group optionally substituted with halogen).

[8] The composition according to any one of [1] to [7], wherein the unit structure derived from a styrene structure is represented by formula (2):

Chem. 2]

formula (2)

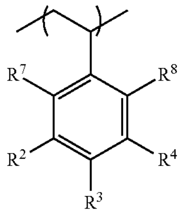

(in formula (2), $R^2$ to $R^4$, $R^7$ and $R^8$ each independently denote a hydrogen atom, a C1-C5 alkoxy group, or a C1-C10 linear, branched or cyclic alkyl group optionally substituted with halogen).

[9] The composition according to any one of [1] to [8], wherein copolymer (A) further comprises:

(b) a unit structure derived from a (meth)acrylic group.

[10] The composition according to [9], wherein the unit structure derived from a (meth)acrylic group is represented by formula (3):

[Chem. 3]

formula (3)

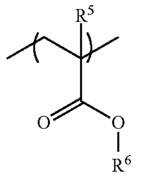

(in formula (3), $R^5$ and $R^6$ each independently denote a hydrogen atom, a C1-C5 alkoxy group, or a C1-C10 linear, branched or cyclic alkyl group optionally substituted with halogen).

[11] The composition according to any one of [1] to [10], wherein copolymer (A) is a copolymer obtained by copolymerizing a monomer mixture comprising a compound represented by formula (4):

[Chem. 4]

formula (4)

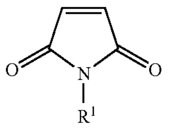

(in formula (4), $R^1$ denotes a hydrogen atom, a C1-C10 linear, branched or cyclic alkyl group, or a C6-C10 aryl group optionally substituted with halogen), and a compound represented by formula (5):

[Chem. 5]

formula (5)

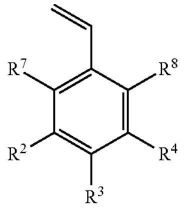

(in formula (5), $R^2$ to $R^4$, $R^7$ and $R^8$ each independently denote a hydrogen atom, a C1-C5 alkoxy group, or a C1-C10 linear, branched or cyclic alkyl group optionally substituted with halogen).

[12] A method for forming a phase-separated pattern in a block copolymer, the method comprising the steps of:
(1) forming a block copolymer layer on a substrate;
(2) forming, on the block copolymer layer, an upper film using the composition according to any one of [1] to [11]; and
(3) inducing phase-separation of the block copolymer layer formed on the substrate.

[13] A method for producing a pattern, comprising the steps of:
(1) forming a block copolymer layer on a substrate;
(2) forming, on the block copolymer layer, an upper film using the composition according to any one of [1] to [11];
(3) inducing phase-separation of the block copolymer layer formed on the substrate; and
(4) etching the phase-separated block copolymer layer.

[14] A method for manufacturing a semiconductor device, comprising the steps of:
(1) forming a block copolymer layer on a substrate;
(2) forming, on the block copolymer layer, an upper film using the composition according to any one of [1] to [11];
(3) inducing phase-separation of the block copolymer layer formed on the substrate; and
(4) etching the phase-separated block copolymer layer;
(5) etching the substrate.

Advantageous Effects of Invention

An upper film formed using the upper film-forming composition of the present invention exhibits a good solubility in a hydrophobic solvent that does not dissolve the block copolymers, and allows for vertical alignment of the block copolymers.

DESCRIPTION OF EMBODIMENTS

[1. Upper Film-Forming Composition]

Figure 1:
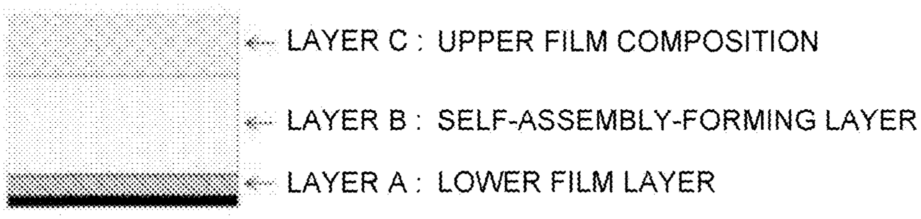
FIG. 1 is a view illustrating an arrangement of a substrate, a lower film (a layer A), a self-assembly-forming film (a layer B), and an upper film composition (a layer C).

An upper film-forming composition according to the present invention is an upper film-forming composition used for inducing phase-separation of a layer comprising a block copolymer on a substrate. The upper film-forming composition contains:
(A) a copolymer comprising (a) a unit structure derived from a maleimide structure and a unit structure derived from a styrene structure; and
(B) a non-aromatic hydrocarbon compound that is liquid at room temperature and atmospheric pressure, as a solvent.

The present composition may be used as an upper film-forming composition, which is applied on a block copolymer thin film to form a film, heated to control the orientation of the block copolymer, and then removed. The use of an upper film formed from the present composition also permits orientation of a block copolymer layer that cannot be oriented by heating alone.

[Copolymer (A)]

[Copolymer Comprising (a) a Unit Structure Derived from a Maleimide Structure and a Unit Structure Derived from a Styrene Structure]

In the present specification, the "maleimide structure" and the "styrene structure" indicate a chemical structure having either a maleimide skeleton or a styrene skeleton, respectively. The "unit structure derived from" means a repeating unit that is derived from a compound having either a maleimide structure or a styrene structure while maintaining the skeleton, and constitutes the main chain of the copolymer.

Preferably, the unit structure derived from a maleimide structure is represented by formula (1):

[Chem. 6]

formula (1)

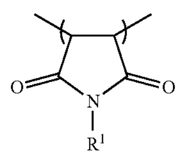

(In formula (1), $R^1$ denotes a hydrogen atom, a C1-C10 linear, branched or cyclic alkyl group, or a C6-C10 aryl group optionally substituted with halogen.)

Preferably, the unit structure derived from a styrene structure is represented by formula (2):

[Chem. 7]

formula (5)

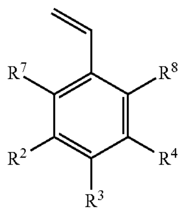

(In formula (2), $R^2$ to $R^4$, $R^7$ and $R^8$ each independently denote a hydrogen atom, a C1-C5 alkoxy group, or a C1-C10 linear, branched or cyclic alkyl group optionally substituted with halogen.) $R^7$ and $R^8$ are preferably hydrogen atoms.

The molar ratios of the unit structure represented by any of formulas (1) and (2) to the whole of copolymer (A) are desirably:

Structural units of formula (1): 30 to 70% by mole

Structural units of formula (2): 20 to 50% by mole based on the whole of copolymer (A).

[(b) Unit Structure Derived from a (meth)acrylic Group]

In addition to formulas (1) and (2), copolymer (A) may further contain (b) a unit structure derived from a (meth) acrylic group.

In the present invention, the (meth)acrylic group means both an acrylic group and a methacrylic group. A (meth) acrylate compound means both an acrylate compound and a methacrylate compound. For example, (meth)acrylic acid means acrylic acid and methacrylic acid.

Preferably, the unit structure derived from a (meth)acrylic group is represented by formula (3):

[Chem. 8]

formula (3)

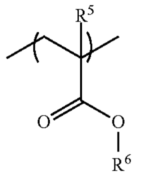

(In formula (3), $R^5$ and $R^6$ each independently denote a hydrogen atom, a C1-C5 alkoxy group, or a C1-C10 linear, branched or cyclic alkyl group optionally substituted with halogen.)

The molar ratio of the unit structure of formula (3) to the whole of copolymer (A) is within the range of 0.1 to 50% by mole, more preferably 0.1 to 30% by mole, still more preferably 0.1 to 20% by mole, and most preferably 0.1 to 10% by mole, based on the whole of copolymer (A).

In formulas (1), (2) and (3), examples of the C1-C15 linear, branched or cyclic alkyl groups include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, 1,1-diethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group. 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group. 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, 2-ethyl-3-methyl-cyclopropyl group, n-heptyl group, 1-methyl-n-heptyl group, n-octyl group, 1-methyl-n-octyl group, n-nonyl group, 1-methyl-n-nonyl group, n-decanyl group, 2-oxohexahydro-2H-3,5-methanocyclopenta[b]furan-6-yl group, 1-adamantyl group, 2-methyl-2-adamantyl group, 2-ethyl-2-adamantyl group, 2-isopropyl-2-adamantyl group, 3-hydroxy-1-adamantyl group and isobornyl group.

In formulas (1), (2) and (3), examples of the C6-C10 aryl groups include phenyl group, benzyl group and naphthyl group.

In formulas (1), (2) and (3), examples of the C1-C5 alkoxy groups include methoxy group, ethoxy group, n-propoxy group, i-propoxy group, cyclopropoxy group, n-butoxy group, i-butoxy group, s-butoxy group, t-butoxy group, cyclobutoxy group, 1-methyl-cyclopropoxy group, 2-methyl-cyclopropoxy group, n-pentoxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, 1,1-diethyl-n-propoxy group, cyclopentoxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group and 2-ethyl-cyclopropoxy group.

Examples of the halogen atoms include F, Cl, Br and I.

The unit structures represented by any of formulas (1), (2) and (3) may be distributed in copolymer (A) in any manner without limitation. That is, in copolymer (A), the unit structures represented by each of formulas (1) and (2) may be copolymerized alternately or may be copolymerized randomly. When copolymer (A) contains the unit structure represented by formula (3), the unit structures represented by each of formulas (1), (2) and (3) may form blocks, respectively, or may be bonded randomly.

The numbers of repetition of the unit structures represented by each of formulas (1), (2) and (3) in copolymer (A) may be selected appropriately while ensuring that the molar percentages of the respective unit structures are within the ranges mentioned hereinabove, and the weight average molecular weight Mw of copolymer (A) is usually within the range of 5,000 to 500,000, preferably 5,000 to 100,000, more preferably 5,000 to 50,000.

[Methods for Producing Copolymer (A)]

A method for producing copolymer (A) used in the present invention includes the step of copolymerizing a monomer mixture that contains a compound represented by formula (4):

[Chem. 9]

formula (4)

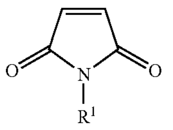

(in formula (4), $R^1$ denotes a hydrogen atom, a C1-C10 linear, branched or cyclic alkyl group, or a C6-C10 aryl group optionally substituted with halogen), and a compound represented by formula (5):

[Chem. 10]

formula (5)

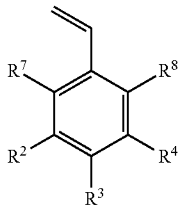

(in formula (5), $R^2$ to $R^4$, $R^7$ and $R^8$ each independently denote a hydrogen atom, a C1-C5 alkoxy group, or a C1-C10 linear, branched or cyclic alkyl group optionally substituted with halogen). $R^7$ and $R^8$ are preferably hydrogen atoms.

The monomer mixture may optionally contain a compound represented by formula (6):

[Chem. 11]

formula (6)

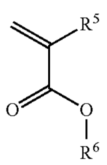

(in formula (6), $R^5$ and $R^6$ each independently denote a hydrogen atom, a C1-C5 alkoxy group, or a C1-C10 linear, branched or cyclic alkyl group optionally substituted with halogen).

The "C1-C15 linear, branched or cyclic alkyl group", the "C6-C10 aryl group", the "C1-C5 alkoxy group" and the "halogen atom" are the same as defined hereinabove.

The monomer mixture preferably contains the compounds represented by any of formulas (4) and (5) in proportions of:

Compound represented by formula (4): 30 to 70% by mole

Compound represented by formula (5): 20 to 50% by mole based on the whole of copolymer (A).

When the monomer mixture contains the compound represented by formula (6), the proportions based on the whole of copolymer (A) are preferably:

Compound represented by formula (4): 30 to 70% by mole

Compound represented by formula (5): 20 to 50% by mole

Compound represented by formula (6): 0.1 to 40% by mole.

Specific examples of the compounds represented by formula (4) include the following:

[Chem. 12]

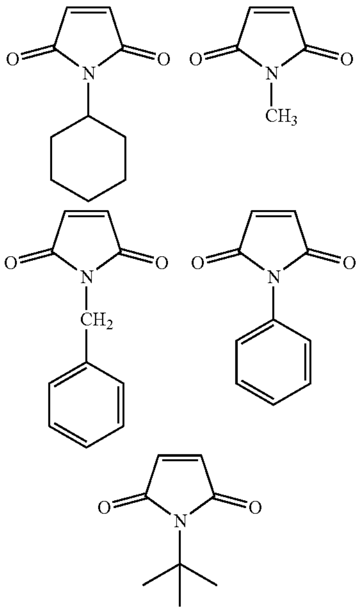

Specific examples of the compounds represented by formula (5) include the following:

[Chem. 13-1]

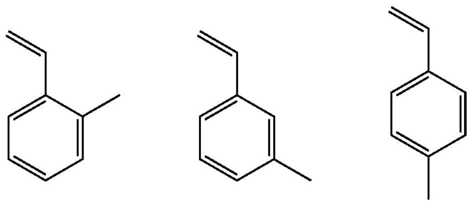

-continued
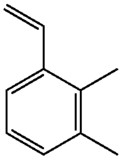
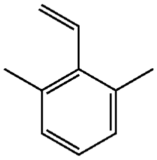
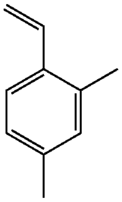
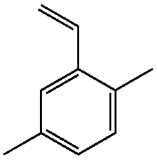
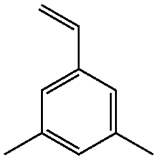
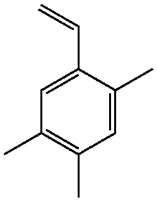
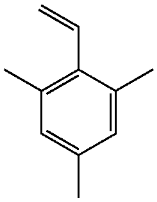
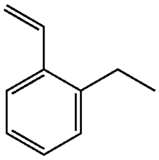
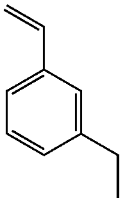
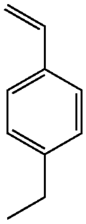
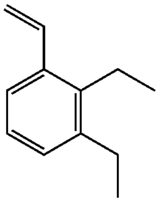
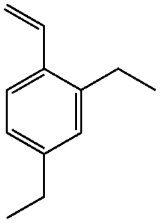
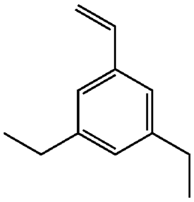
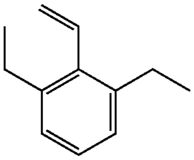
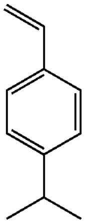
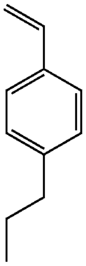
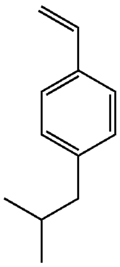
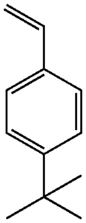
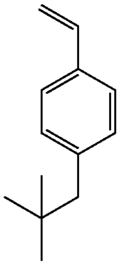
-continued
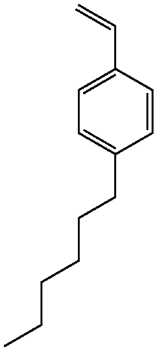
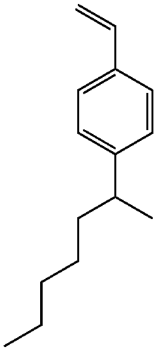
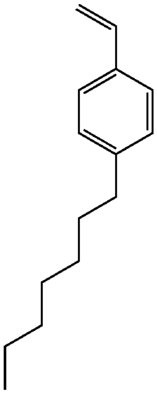
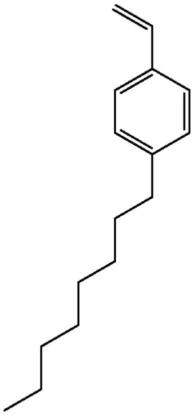
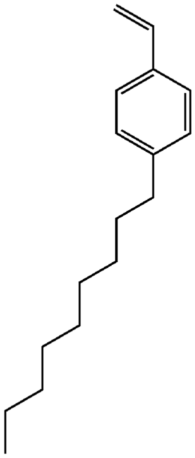
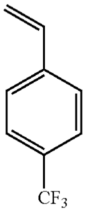
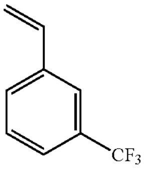
[Chem. 13-2]
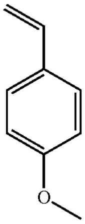
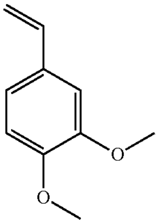
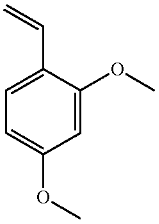
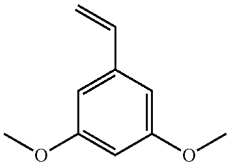
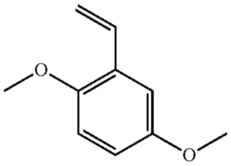

-continued
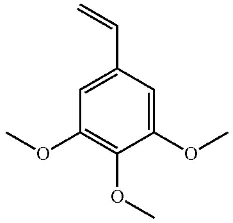
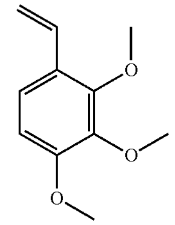
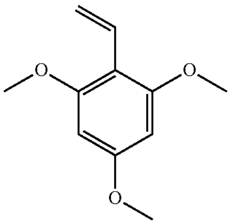
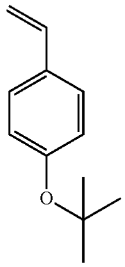
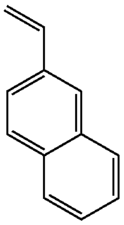
Specific examples of the compounds represented by formula (6) include the following:
[Chem. 14-1]
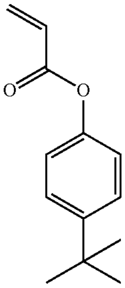
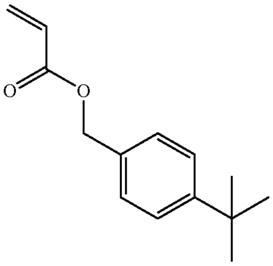
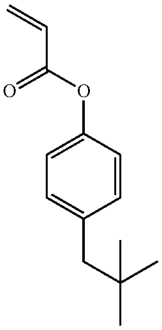
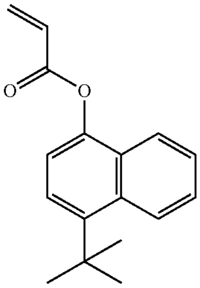
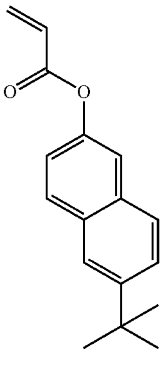
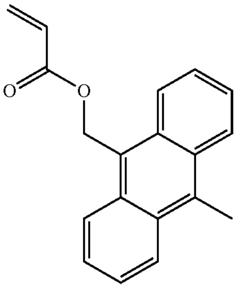
-continued
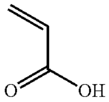
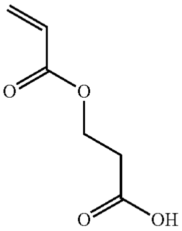
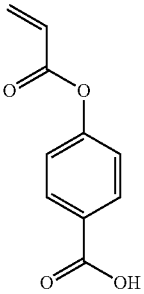
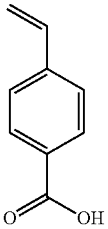
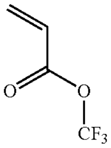
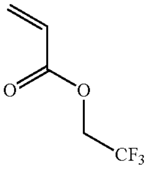
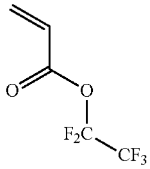
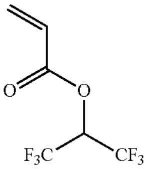
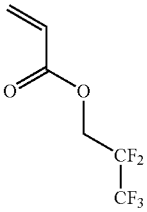
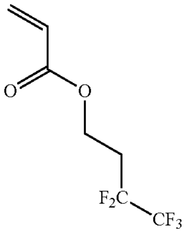
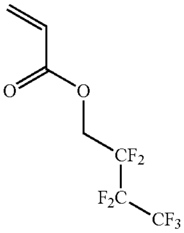
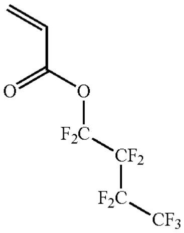
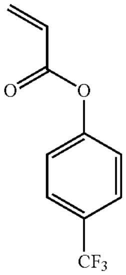
[Chem. 14-2]
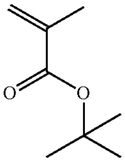
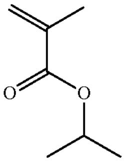
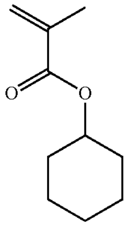
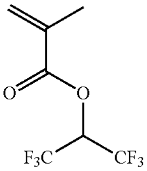
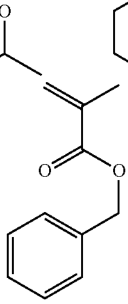

-continued

[Chem. 14-3]

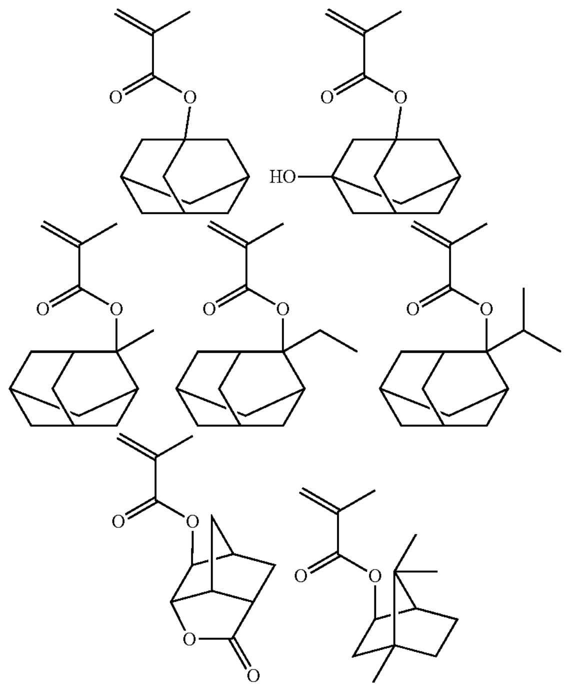

Copolymer (A) may be obtained by a known polymerization method. Known polymerization methods include, for example, radical polymerization, anionic polymerization and cationic polymerization. Various known techniques such as solution polymerization, suspension polymerization, emulsion polymerization and bulk polymerization may be used.

A polymerization initiator, which may be used at the time of polymerization, includes 2,2'-azobis(isobutyronitrile), 2,2'-azobis(2-methylbutyronitrile), 2,2'-azobis(2,4-dimethylvaleronitrile), 4,4'-azobis(4-cyanovaleric acid), 2,2'-azobis (2,4-dimethylvaleronitrile), 2,2'-azobis(4-methoxy-2,4-dimethylvaleronitrile), 2,2'-azobis(isobutyronitrile), 1,1'-azobis (cyclohexane-1-carbonitrile), 1-[(1-cyano-1-methylethyl) azo] formamide, 2,2'-azobis[2-(2-imidazolin-2-yl) propane] dihydrochloride, 2,2'-azobis[2-(2-imidazolin-2-yl) propane] and 2,2'-azobis(2-methylpropionamidine) dihydrochloride.

A solvent, which may be used at the time of polymerization, includes dioxane, ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate and butyl lactate. These may be used each alone or in combination of two or more thereof.

Copolymer (A) used in the present invention may be obtained by carrying out the reaction while stirring under reaction conditions of 50° C. to 200° C. for 1 hour to 48 hours.

The solution thus obtained that contains copolymer (A) may be used directly for the preparation of the upper film-forming composition. Alternatively, copolymer (A) may be used after being recovered by precipitation in a poor solvent such as methanol, ethanol, isopropanol or water, or a mixture of such solvents, followed by isolation.

The isolated copolymer (A) may be directly, or after being dried, redissolved into a non-aromatic hydrocarbon compound described later that is liquid at room temperature and atmospheric pressure and used. When the copolymer is dried, the drying conditions are desirably at 30 to 100° C. for 6 to 48 hours with a device such as an oven. Copolymer (A) may be recovered and redissolved into a non-aromatic hydrocarbon compound described later that is liquid at room temperature and atmospheric pressure, for preparing a composition of the present invention, which may be used as an upper film-forming composition.

The weight average molecular weight of copolymer (A) used in the present invention, measured by a gel permeation chromatography (GPC) method, varies depending on factors such as the coating solvent that is used, and the solution viscosity; however, it is usually within the range of 5,000 to 500,000, preferably 5,000 to 100,000, and more preferably 5,000 to 50,000, in terms of polystyrene.

[Solvent (B)]

The solvent used in the composition of the present invention is a non-aromatic hydrocarbon compound that is liquid at room temperature and atmospheric pressure. More specifically, the non-aromatic hydrocarbon compound that is liquid at room temperature and atmospheric pressure and is used as the solvent in the composition of the present application (hereinbelow, sometimes written as the "non-aromatic hydrocarbon solvent") is as follows.

Preferably, the non-aromatic hydrocarbon compound that is liquid at room temperature and atmospheric pressure is a C4-C26 non-aromatic hydrocarbon compound.

Preferably, the non-aromatic hydrocarbon compound that is liquid at room temperature and atmospheric pressure is a non-cyclic hydrocarbon compound or a cyclic hydrocarbon compound.

Preferably, the non-cyclic hydrocarbon compound is a saturated linear hydrocarbon compound (SLC), an unsaturated linear hydrocarbon compound (ULC), a saturated branched hydrocarbon compound (SBC) or an unsaturated branched hydrocarbon compound (UBC).

Preferably, the cyclic hydrocarbon compound is a substituted monocyclic compound (S1R), a substituted bicyclic compound (S2R), a substituted fused-ring compound (SFR), an unsubstituted bicyclic compound (U2R) or an unsubstituted fused-ring compound (UFR).

The substituents are not particularly limited. Some preferred substituents are C1-C12 linear, branched or cyclic alkyl, alkenyl or alkynyl groups, and halogen atoms.

Examples of the C1-C12 linear, branched or cyclic alkyl, alkenyl or alkynyl groups include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, 1,1-diethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-hexyl group, 1-methyl-n-pentyl group, 2-methyl-n-pentyl group. 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group. 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, 2-ethyl-3-methyl-cyclopropyl group, n-heptyl group, 1-methyl-n-heptyl group, n-octyl group, 1-methyl-n-octyl group, n-nonyl group, 1-methyl-n-nonyl group, n-decanyl group, vinyl group, ethynyl group, allyl group, isopropenyl group, propylidene group and isopropylidene group.

Examples of the halogen atoms include F, Cl, Br and I.

Preferably, the cyclic hydrocarbon compound is a C6-C19 cyclic hydrocarbon compound. The number of carbon atoms in this case includes the number of carbon atoms of a substituent.

Specific examples of the saturated linear hydrocarbon compounds (SLC) include C4-C14 alkanes typified by, for example, n-octane, n-nonane and n-decane.

Specific examples of the unsaturated linear hydrocarbon compounds (ULC) include the following C4-C14 compounds:

[Chem. 15]

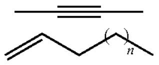

1 ≤ n ≤ 10

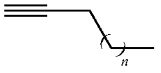

1 ≤ n ≤ 10

Specific examples of the saturated branched hydrocarbon compounds (SBC) include the following C5-C26 compounds:

[Chem. 16]

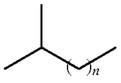

1 ≤ n ≤ 10

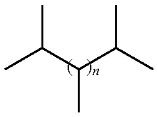

1 ≤ n ≤ 10

-continued

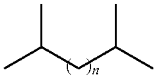

1 ≤ n ≤ 10

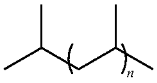

1 ≤ n ≤ 2

Specific examples of the saturated linear hydrocarbon compounds (SLC) include the following C6-C16 compounds:

[Chem. 17]

1 ≤ n ≤ 10

Specific examples of the unsaturated branched hydrocarbon compounds (UBC) include the following compounds:

[Chem. 18]

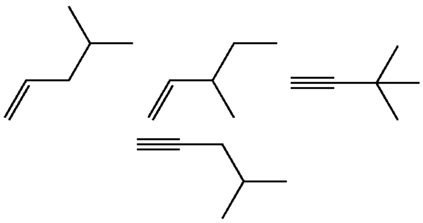

Specific examples of the substituted monocyclic compounds (SIR) include the following C6-C19 compounds:

[Chem. 19]

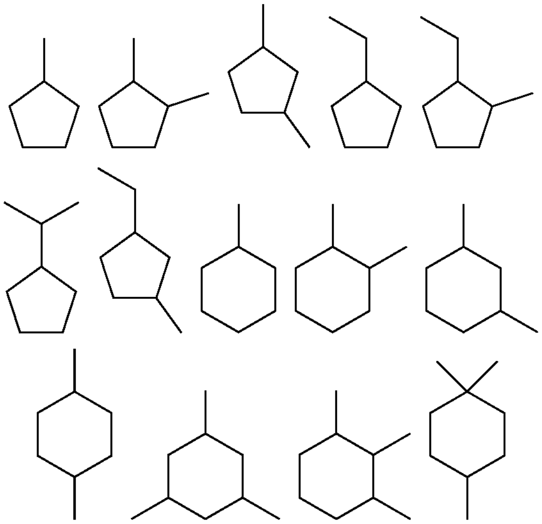

-continued

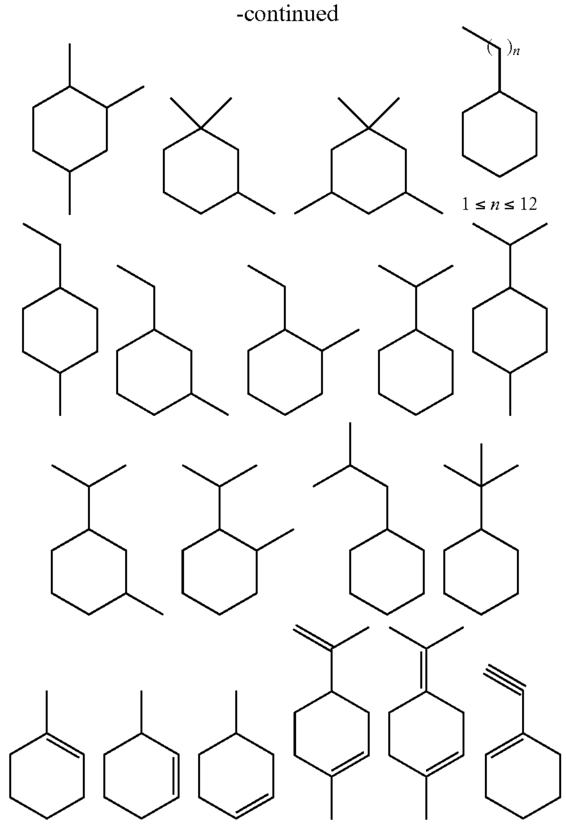

1 ≤ n ≤ 12

Specific examples of the unsubstituted bicyclic compounds (U2R) include the following compound:

[Chem. 20]

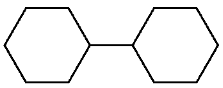

Specific examples of the unsubstituted fused-ring compounds (UFR) include the following compounds:

[Chem. 21]

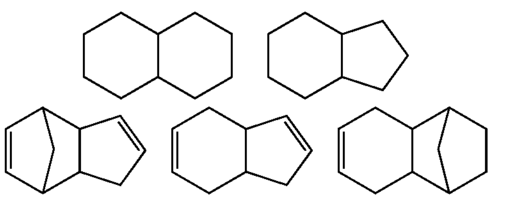

Of these solvents enumerated above, preferred ones include C8-C10 saturated linear hydrocarbon compounds and C7-C10 substituted monocyclic compounds, which are superior in the balance between the solubility of copolymer (A) and the insolubility of the block copolymer of the present application. Particularly preferred solvents are C8 saturated linear hydrocarbon compounds, C10 saturated linear hydrocarbon compounds, and substituted cyclohexanes (for example, 1-methyl-4-isopropylcyclohexane).

The solvents may be used each alone or in combination of two or more thereof.

For the convenience of the synthesis of copolymer (A) used in the present invention, the non-aromatic hydrocarbon solvent mentioned above may be mixed with an organic solvent, for example, mentioned in the section of the method for producing copolymer (A). The solvent other than the non-aromatic hydrocarbon solvent may be present in a ratio of 0.01 to 13% by mass relative to the non-aromatic hydrocarbon solvent.

[Additives]

The upper film-forming composition according to the present invention may further include additives such as surfactants and rheology modifiers.

In addition to the components described hereinabove, additives such as rheology modifiers and surfactants may be added as required to the upper film-forming composition of the present invention. Rheology modifiers may be added mainly for the purpose of enhancing the fluidity of the composition of the present invention. Specific examples include phthalic acid derivatives such as dimethyl phthalate, diethyl phthalate, diisobutyl phthalate, dihexyl phthalate and butyl isodecyl phthalate; adipic acid derivatives such as di-n-butyl adipate, diisobutyl adipate, diisooctyl adipate and octyl decyl adipate; maleic acid derivatives such as di-n-butyl maleate, diethyl maleate and dinonyl maleate; oleic acid derivatives such as methyl oleate, butyl oleate and tetrahydrofurfuryl oleate; and stearic acid derivatives such as n-butyl stearate and glyceryl stearate. The rheology modifier is usually added in a proportion of less than 30% by mass relative to the whole of the composition of the present invention taken as 100% by mass.

To eliminate the occurrence of defects such as pinholes or striation and to further enhance the applicability to surface unevenness, the upper film-forming composition of the present invention may include a surfactant. Examples of the surfactants include nonionic surfactants such as polyoxyethylene alkyl ethers including polyoxyethylene lauryl ether, polyoxyethylene stearyl ether, polyoxyethylene cetyl ether and polyoxyethylene oleyl ether, polyoxyethylene alkylaryl ethers including polyoxyethylene octylphenol ether and polyoxyethylene nonylphenol ether, polyoxyethylene/polyoxypropylene block copolymers, sorbitan fatty acid esters including sorbitan monolaurate, sorbitan monopalmitate, sorbitan monostearate, sorbitan monooleate, sorbitan trioleate and sorbitan tristearate, and polyoxyethylene sorbitan fatty acid esters including polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate, fluorosurfactants such as EFTOP series EF301, EF303 and EF352 (manufactured by Tohkem Products Corp.), MEGAFACE series F171 and F173 (manufactured by DIC CORPORATION), Fluorad series FC430 and FC431 (manufactured by Sumitomo 3M Limited), AsahiGuard AG710, Surflon series S-382, SC101, SC102, SC103, SC104, SC105 and SC106 (manufactured by AGC Inc.), and FTERGENT series (manufactured by NEOS COMPANY LIMITED), and organosiloxane polymer KP341 (manufactured by Shin-Etsu Chemical Co., Ltd.). The amount of the surfactant is usually 0.2% by mass or less, and preferably 0.1% by mass or less of the whole of the upper film-forming composition of the present invention taken as 100% by mass. The surfactants may be added each alone or in combination of two or more thereof.

The proportion of copolymer (A) in the solid content of the composition is preferably 20% by mass or more, for example, within the range of 20 to 100% by mass, or 30 to 100% by mass. The solid content of the composition of the present invention is preferably within the range of 0.1 to 50% by mass, and more preferably 0.3 to 30% by mass. Here, the solid content is the residue after removal of the solvent components from the upper film-forming composition.

The upper film-forming composition of the present invention may be produced by mixing, for example, by mixing copolymer (A), the non-aromatic hydrocarbon compound liquid at room temperature and atmospheric pressure as a solvent, and, if necessary, the above-mentioned additives in accordance with the proportions mentioned hereinabove, while stirring at room temperature to 40° C.

2. Method for Forming a Phase-Separated Pattern in a Block Copolymer

The upper film-forming composition according to the present invention is used to induce phase-separation of a layer comprising a block copolymer on a substrate.

A method for forming a phase-separated pattern in a block copolymer according to the present invention includes the steps of:

(1) forming a block copolymer layer on a substrate;

(2) forming, on the block copolymer layer, an upper film using the upper film-forming composition; and (3) inducing phase-separation of the block copolymer layer formed on the substrate.

(1) Step of Forming a Block Copolymer Layer on a Substrate

A block copolymer includes a plurality of types of polymers (blocks) that are chemically different from one another and are covalently bonded to one another. Block copolymers are capable of forming a nanometer-scale pattern, and numerous applications have been suggested based on this ability. For example, a self-assembled pattern of a block copolymer may be used as a nanolithographic mask or as a template for further synthesis of an inorganic or organic structure. This can be achieved by taking advantage of the fact that the blocks have different etching rates.

A block copolymer used in the present invention includes an organic polymer chain (A) that contains an organic monomer (a) as a unit structure, and a polymer chain (B) that contains a monomer (b) as a unit structure different from the organic monomer (a) and is bonded to the organic polymer chain (A).

The solid content in a self-assembled film-forming composition may be 0.1 to 10% by mass, or 0.1 to 5% by mass, or 0.1 to 3% by mass. The solid content is the remaining proportion after removal of solvents from the film-forming composition.

The proportion of the block copolymer in the solid content may be within the range of 30 to 100% by mass, or 50 to 100% by mass, or 50 to 90% by mass, or 50 to 80% by mass.

The block copolymer may include two, or three or more types of blocks. The number of blocks present in the block copolymer may be two, or three or more.

Depending on the type of the polymer chain (B), the copolymer may include, for example, an adjacent polymer chain (C) that contains a monomer (c) as a unit structure.

Examples of the combinations of the blocks in the polymer include AB, ABAB, ABA and ABC.

For example, the block copolymer is synthesized by living radical polymerization or living cationic polymerization, in which the polymerization process consists solely of initiation reaction and growth reaction without any side reactions that inactivate the growth end. The growth end can keep the active growth reaction continued during the polymerization reaction. By eliminating chain transfer, a polymer (A) having a uniform lengths can be obtained. While using the growth end of the polymer (A), addition of another monomer (b) makes it possible to proceed the polymerization in the presence of the monomer (b) to form a block copolymer (AB).

When, for example, the blocks are of two types, A and B, the molar ratio of the polymer chain (A) to the polymer chain (B) may be 1:9 to 9:1, preferably 3:7 to 7:3.

The volume ratio in the block copolymer of the present application is, for example, 30:70 to 70:30.

The homopolymer A or B is a polymerizable compound that has at least one radically polymerizable reactive group (vinyl group or vinyl-containing organic group).

The weight average molecular weight Mw of the block copolymer used in the present invention is within the range of 1,000 to 100,000, preferably 5,000 to 100,000, more preferably 5,000 to 50,000, and most preferably 5,000 to 30,000. If the weight average molecular weight is less than 1,000, the applicability to a base substrate is sometimes poor. If the weight average molecular weight is 100,000 or more, the solubility with respect to a solvent is sometimes unsatisfactory.

The polydispersity (Mw/Mn) of the block copolymer of the present application is preferably within the range of 1.00 to 1.50, and particularly preferably 1.00 to 1.20.

Specific examples of the block copolymers include a combination of, for example, an aromatic polymer chain and an acrylic resin polymer chain. More specific examples include a combination of a poly(vinylpyridine) derivative polymer and a polyacrylic acid ester derivative polymer, such as poly(4-vinylpyridine) and polymethyl methacrylate; a combination of a polyacrylic acid derivative polymer and a polystyrene derivative polymer; and a combination of a poly(hydroxystyrene) derivative polymer and a polyacrylic acid ester derivative polymer.

Furthermore, for example, a wider difference in dry etching rate can be advantageously obtained by combining a silicon-free polymer chain and a silicon-containing polymer chain, for example, a polysilane such as polydihexylsilane, a polysiloxane such as polydimethylsiloxane, or a silylated polystyrene derivative such as poly(trimethylsilylstyrene) or poly(pentamethyldisilylstyrene).

In particular, the silylated polystyrene derivative is preferably poly(4-trimethylsilylstyrene) or poly(4-pentamethyldisilylstyrene) having a substituent at the 4-position.

Of these, a combination of a silylated polystyrene derivative and a polystyrene derivative polymer, a combination of two different polystyrene derivative polymers, or a combination of a silylated polystyrene derivative polymer and polylactide is preferable.

Of these, a combination of a 4-substituted silylated polystyrene derivative and a 4-substituted polystyrene derivative polymer, a combination of two different 4-substituted polystyrene derivative polymers, or a combination of a 4-substituted silylated polystyrene derivative polymer and polylactide is preferable.

More preferred specific examples of the block copolymers include a combination of poly(trimethylsilylstyrene) and polymethoxystyrene, a combination of polystyrene and poly(tert-butylstyrene), a combination of polystyrene and poly(trimethylsilylstyrene), and a combination of poly(trimethylsilylstyrene) and poly(D,L-lactide).

More preferred specific examples of the block copolymers include a combination of poly(4-trimethylsilylstyrene) and poly(4-methoxystyrene), a combination of polystyrene and poly(4-tert-butylstyrene), a combination of polystyrene and poly(4-trimethylsilylstyrene), and a combination of poly(4-trimethylsilylstyrene) and poly(D,L-lactide).

The substrate is selected from the group consisting of silicon, silicon oxide, glass, surface-modified glass, plastics, ceramics, transparent substrates, flexible substrates, and substrates used in roll-to-roll processing (or combinations of these substrates). The substrate is preferably a silicon wafer, quartz, glass or a plastic, and more preferably a silicon wafer.

Where necessary, the substrate may be provided with a lower film to neutralize the surface energy. The lower film is formed on the substrate by a conventional technique such as spin coating so as to have a predetermined film thickness, and is subsequently treated, for example, heated or submerged, as required.

The block copolymer is applied onto the substrate or the lower film by a conventional technique such as spin coating so as to have a predetermined film thickness.

(2) Step of Forming, on the Block Copolymer Layer, an Upper Film Using the Upper Film-Forming Composition The upper film-forming composition is as described hereinabove. The upper film-forming composition provided is applied onto the block copolymer layer by a conventional technique such as spin coating to form an upper film. The film thickness of the upper film is not particularly limited, but is generally within the range of 3 nm to 100 nm, preferably 10 to 70 nm, and particularly preferably 20 to 60 nm. If the film thickness is not more than 3 nm, a desired uniform phase-separated pattern cannot be formed in the block copolymer. If the film thickness is not less than 100 nm, the etching process disadvantageously takes a long time. The upper film-forming composition according to the present invention is highly advantageous in that the solvent or the mixture of solvents in the composition does not damage or dissolve the block copolymer, and does not substantially swell the block copolymer.

(3) Step of Inducing Phase-Separation of the Block Copolymer Layer Formed on the Substrate The block copolymer layer can be phase-separated by a treatment that rearranges the block copolymer materials in the presence of the upper film, such as, for example, ultrasonic treatment, solvent treatment or thermal annealing. In many applications, phase separation of the block copolymer layer is desirably achieved by simple heating or the so-called thermal annealing. Thermal annealing may be performed in the air or an inert gas at atmospheric pressure, reduced pressure or increased pressure.

The phase separation of the block copolymer layer results in block copolymer domains that are oriented substantially perpendicular with respect to the plane of the substrate or the lower film. For example, the morphology of the domains is lamellar, spherical, columnar or other shape. The domain spacing is, for example, 50 nm or less, 40 nm or less, 30 nm or less, or 20 nm or less. The method of the present invention is capable of forming a structure having a desired size, shape, orientation and periodicity.

The upper film may be stripped after the block copolymer layer has been phase-separated. For example, the stripping may be performed using a solvent or a mixture of solvents (stripping solvents) that does not damage or dissolve the block copolymer and does not substantially swell the block copolymer. The stripped upper film composition may be isolated and reused. For example, the isolation may be performed by a conventional technique such as precipitation or distillation.

A method for producing a pattern according to the present invention comprises the steps of:

(1) forming a block copolymer layer on a substrate;

(2) forming, on the block copolymer layer, an upper film using the upper film-forming composition described hereinabove;

(3) inducing phase-separation of the block copolymer layer formed on the substrate; and (4) etching the phase-separated block copolymer layer.

The block copolymer layer phase-separated by the above method may be further subjected to an etching step. Usually, portions of the phase-separated block copolymer are removed before etching. The etching may be performed by a known technique. This method may be used for the manufacture of a semiconductor substrate.

That is, a method for manufacturing a semiconductor device according to the present invention comprises the steps of:

(1) forming a block copolymer layer on a substrate;

(2) forming, on the block copolymer layer, an upper film using the upper film-forming composition described hereinabove;

(3) inducing phase-separation of the block copolymer layer formed on the substrate;

(4) etching the phase-separated block copolymer layer; and (5) etching the substrate.

For the etching, a gas such as tetrafluoromethane ($CF_4$), perfluorocyclobutane ($C_4F_8$), perfluoropropane ($C_3F_8$), trifluoromethane ($CHF_3$), difluoromethane ($CH_2F_2$), carbon monoxide, argon, oxygen, nitrogen, sulfur hexafluoride, difluoromethane, nitrogen trifluoride and chlorine trifluoride, chlorine, trichloroborane or dichloroborane, or a combination of the above gases may be used, for example.

A desired shape may be given to the workpiece substrate by etching while utilizing the pattern of the phase-separated block copolymer layer formed using the upper film-forming composition according to the present invention, and a favorable semiconductor device can be manufactured.

EXAMPLES

Hereinbelow, the present invention will be described in greater detail with reference to Examples and Comparative Examples. However, it should be construed that the scope of the present invention is not limited to the examples given below.

Example 1

(Preparation of Self-Assembled Film-Forming Composition 1 Comprising Block Copolymer 1)

0.5 g of a block copolymer, i.e., poly(4-methoxystyrene)/poly(4-trimethylsilylstyrene) copolymer (weight average molecular weight Mw: 30,200, polydispersity: 1.12, volume ratio: 50:50) was dissolved into 24.5 g of propylene glycol monomethyl ether acetate to yield a 2% by mass solution. The solution was then filtered through a polyethylene microfilter having a pore size of 0.02 μm, to prepare a solution of a self-assembled film-forming composition 1 comprising a block copolymer 1.

(Preparation of Self-Assembled Film-Forming Composition 2 Comprising Block Copolymer 2)

0.5 g of a block copolymer, i.e., poly(4-methoxystyrene)/poly(4-trimethylsilylstyrene) copolymer (weight average molecular weight Mw: 17600, polydispersity: 1.11, volume ratio: 50:50) was dissolved into 24.5 g of propylene glycol monomethyl ether acetate to yield a 2% by mass solution. The solution was then filtered through a polyethylene microfilter having a pore size of 0.02 μm, to prepare a solution of a self-assembled film-forming composition 2 comprising a block copolymer 2.

(Evaluation of Solvent Resistance of Self-Assembled Block Copolymer Films)

Each of the self-assembled film-forming compositions comprising either the block copolymer 1 or 2 was applied with a spin coater and was heated on a hot plate at 100° C. for 1 minute to form a self-assembled film having a film thickness of 40 nm. The coating films obtained were submerged in n-octane for 1 minute, spin-dried, and heated at 100° C. for 30 seconds. The film thickness of the films was then measured to determine the amount of change in film thickness.

Examples 2 and 3

The solvent resistance of the block copolymer layers was evaluated in the same manner as in Example 1, except that n-octane was replaced by n-decane or p-menthane.

Comparative Examples 1 to 5

The solvent resistance of the block copolymer layers was evaluated in the same manner as in Example 1, except that n-octane was replaced by diisoamyl ether, propylene glycol monomethyl ether acetate, propylene glycol monomethyl ether, butyl acetate or 2-heptanone.

(Discussion of Solvent Resistance of Block Copolymer Layers)

Table 1 shows the results of solvent resistance evaluated in Examples 1 to 3 and Comparative Examples 1 to 5.

TABLE 1

| | | Amount of change in film thickness | |
|---|---|---|---|
| | Solvent | Self-assembly-forming composition 1 | Self-assembly-forming composition 2 |
| Ex. 1 | n-Octane | less than 1 nm | less than 1 nm |
| Ex. 2 | n-Decane | less than 1 nm | less than 1 nm |
| Ex. 3 | p-Menthane | less than 1 nm | less than 1 nm |
| Comp. Ex. 1 | Diisoamyl ether | less than 1 nm | 1 nm or more |
| Comp. Ex. 2 | Propylene glycol monomethyl ether acetate | 1 nm or more | 1 nm or more |
| Comp. Ex. 3 | Propylene glycol monomethyl ether | 1 nm or more | 1 nm or more |
| Comp. Ex. 4 | Butyl acetate | 1 nm or more | 1 nm or more |
| Comp. Ex. 5 | 2-Heptanone | 1 nm or more | 1 nm or more |

The weight average molecular weight (Mw) of polymers (A) described in Synthesis Examples below is the results measured by a gel permeation chromatography (GPC) method. The measurement was performed using a GPC device manufactured by TOSOH CORPORATION under the following measurement conditions.

Measurement device: HLC-8020GPC [product name] (manufactured by TOSOH CORPORATION)

GPC columns: TSKgel G2000HXL: two columns; G3000HXL: one column; G4000HXL: one column [product names] (all manufactured by TOSOH CORPORATION)

Column temperature: 40° C.

Solvent: Tetrahydrofuran (THF)

Flow rate: 1.0 ml/min

Standard sample: Polystyrene (manufactured by TOSOH CORPORATION)

[Synthesis Example 1] Synthesis of Polymer 1

3.20 g of N-cyclohexylmaleimide, 2.00 g of 4-tert-butylstyrene, 0.76 g of tert-butyl methacrylate and 0.18 g of 2,2'-azobisisobutyronitrile were dissolved into 24.0 g of propylene glycol monomethyl ether acetate. The resultant solution was heated and was stirred at 140° C. for about 2 hours. This reaction solution was added dropwise to methanol. The precipitate was recovered by suction filtration, and the recovered precipitate was then dried under reduced pressure at 60° C. to recover a polymer 1. The weight average molecular weight Mw measured by GPC in terms of polystyrene was 13,100.

[Synthesis Example 2] Synthesis of Polymer 2

3.14 g of N-cyclohexylmaleimide, 2.24 g of 4-tert-butylstyrene, 0.45 g of isopropyl methacrylate and 0.18 g of 2,2'-azobisisobutyronitrile were dissolved into 24.0 g of propylene glycol monomethyl ether acetate. The resultant solution was heated and was stirred at 140° C. for about 2 hours. This reaction solution was added dropwise to methanol. The precipitate was recovered by suction filtration, and the recovered precipitate was then dried under reduced pressure at 60° C. to recover a polymer 2. The weight average molecular weight Mw measured by GPC in terms of polystyrene was 12,800.

[Synthesis Example 3] Synthesis of Polymer 3

3.06 g of N-cyclohexylmaleimide, 2.19 g of 4-tert-butylstyrene, 0.58 g of cyclohexyl methacrylate and 0.18 g of 2,2'-azobisisobutyronitrile were dissolved into 24.0 g of propylene glycol monomethyl ether acetate. The resultant solution was heated and was stirred at 140° C. for about 2 hours. This reaction solution was added dropwise to methanol. The precipitate was recovered by suction filtration, and the recovered precipitate was then dried under reduced pressure at 60° C. to recover a polymer 3. The weight average molecular weight Mw measured by GPC in terms of polystyrene was 11,700.

[Synthesis Example 4] Synthesis of Polymer 4

2.80 g of N-cyclohexylmaleimide, 1.50 g of 4-tert-butylstyrene, 1.64 g of isopropyladamantyl methacrylate and 0.06 g of 2,2'-azobisisobutyronitrile were dissolved into 24.0 g of propylene glycol monomethyl ether acetate. The resultant solution was heated and was stirred at 140° C. for about 2 hours. This reaction solution was added dropwise to methanol. The precipitate was recovered by suction filtration, and the recovered precipitate was then dried under reduced pressure at 60° C. to recover a polymer 4. The weight average molecular weight Mw measured by GPC in terms of polystyrene was 34,600.

[Synthesis Example 5] Synthesis of Polymer 5

2.78 g of N-cyclohexylmaleimide, 1.24 g of 4-tert-butylstyrene, 1.93 g of ethyladamantyl methacrylate and 0.05 g of 2,2'-azobisisobutyronitrile were dissolved into 24.0 g of propylene glycol monomethyl ether acetate. The resultant solution was heated and was stirred at 140° C. for about 2 hours. This reaction solution was added dropwise to methanol. The precipitate was recovered by suction filtration, and the recovered precipitate was then dried under reduced pressure at 60° C. to recover a polymer 5. The weight average molecular weight Mw measured by GPC in terms of polystyrene was 21,100.

Example 4

(Preparation of Upper Film Composition 1)

0.25 g of the resin obtained in Synthesis Example 1 was dissolved into 9.75 g of p-menthane, with which good results had been obtained in Examples 1 to 3, thereby forming a 2.5% by mass solution. Subsequently, the solution was filtered through a polyethylene microfilter having a pore size of 0.2 μm to yield a solution of an upper film-forming composition 1 for forming an upper film on a self-assembled film.

(Preparation of Lower Film-Forming Composition 1)

0.1 g of poly(styrene-co-4-tert-butylstyrene) having a hydroxy group at the terminal was dissolved into 19.9 g of propylene glycol monomethyl ether acetate to yield a 0.5% by mass solution. The solution was then filtered through a polyethylene microfilter having a pore size of 0.02 μm to prepare a solution of a lower film-forming composition comprising a block copolymer for forming a lower film under a self-assembled film.

(Evaluation of Self-Assembling Performance of Block Copolymer)

The above lower film-forming composition 1 for forming a lower film under a self-assembled film was applied onto a silicon wafer, heated on a hot plate at 240° C. for 1 minute, and submerged in propylene glycol monomethyl ether acetate for 1 minute to form a lower film (layer A). The self-assembled film-forming composition 2 comprising the block copolymer 2 was applied thereon with a spin coater and was heated on a hot plate at 100° C. for 1 minute to form a self-assembled film (layer B) having a film thickness of 40 nm. The upper film-forming composition 1 was applied further thereon with a spinner and was subsequently heated on a hot plate at 200° C. for 10 minutes to induce a microphase-separated structure in the block copolymer. FIG. 1 illustrates the arrangement of the layers.

(Observation of Microphase-Separated Structure)

Figure 2:
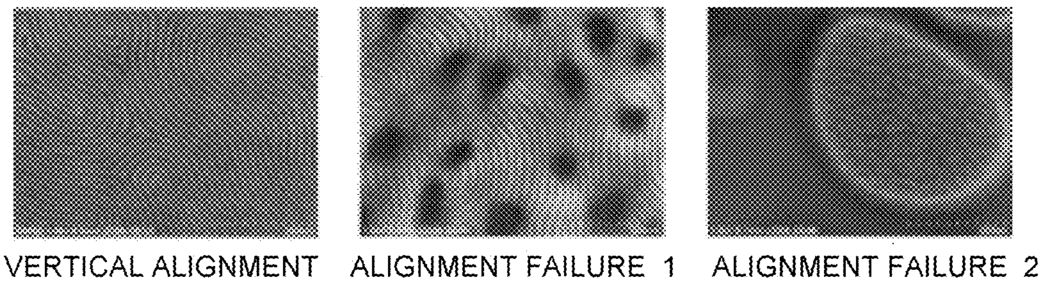
FIG. 2 shows scanning electron micrographs of the block copolymer layers phase-separated with the upper film compositions (Examples 4 to 8 and Comparative Examples 6 to 10, Table 2).

The silicon wafer with the microphase-separated structure induced thereon was etched with an etching device (Lam 2300 Versys Kiyo 45) manufactured by LAM RESEARCH CORPORATION using O2 gas as an etching gas for 25 seconds to remove the upper film and to preferentially etch the polymethoxystyrene domains. Subsequently, the morphology thereof was observed with an electron microscope (S-4800) (FIG. 2).

Examples 5 to 8

Preparation of the samples and formation of microphase-separated structure in the block copolymer were carried out in the same manner as in Example 4, except that polymer 1 was replaced by each of polymers 2 to 5.

Comparative Examples 6 to 10

Preparation of the samples and formation of microphase-separated structure in the block copolymer were carried out in the same manner as in Example 4, except that the solvent in the upper film-forming composition was changed from p-menthane to each of diisoamyl ether, propylene glycol monomethyl ether acetate, propylene glycol monomethyl ether, butyl acetate and 2-heptanone, with which poor results had been obtained in Comparative Examples 1 to 5.

(Determination of Alignment of Block Copolymer)

The solubility of the upper films prepared in Examples 4 to 8 and Comparative Examples 6 to 10, and the alignment of the block copolymer were confirmed. The results are shown in Table 2 and FIG. 2.

TABLE 2

| | Solubility of upper film resin | Alignment of block copolymer |
|---|---|---|
| Ex. 4 | Soluble | Vertical alignment |
| Ex. 5 | Soluble | Vertical alignment |
| Ex. 6 | Soluble | Vertical alignment |
| Ex. 7 | Soluble | Vertical alignment |
| Comp. Ex. 6 | Soluble | Alignment failure 1 |
| Comp. Ex. 7 | Soluble | Alignment failure 2 |
| Comp. Ex. 8 | Soluble | Alignment failure 2 |
| Comp. Ex. 9 | Soluble | Alignment failure 2 |
| Comp. Ex. 10 | Soluble | Alignment failure 2 |

As seen in Table 2, the top coats prepared using the upper film-forming compositions of the present invention could be applied without dissolving the block copolymer, and could cause vertical alignment of the block copolymer.

INDUSTRIAL APPLICABILITY

The upper film-forming composition is highly useful in industry, because the composition provides an upper film that allows for vertical alignment of a block copolymer on a substrate without causing dissolution or swelling the layer comprising the block copolymer and exhibits a good solubility to a hydrophobic solvent.

The invention claimed is:

1. An upper film-forming composition comprising:

(A) a copolymer comprising (a) a unit structure derived from a maleimide structure and a unit structure derived from a styrene structure; and (B) a non-aromatic hydrocarbon compound that is liquid at room temperature and atmospheric pressure, as a solvent, wherein the upper film-forming composition is used to induce phase-separation of a layer comprising a block copolymer on a substrate.

2. The upper film-forming composition according to claim 1, wherein the solvent is a C4-C26 non-aromatic hydrocarbon compound.

3. The upper film-forming composition according to claim 1, wherein the solvent is a non-cyclic hydrocarbon compound or a cyclic hydrocarbon compound.

4. The upper film-forming composition according to claim 3, wherein the non-cyclic hydrocarbon compound is a saturated linear, unsaturated linear, saturated branched, or unsaturated branched hydrocarbon compound.

5. The upper film-forming composition according to claim 3, wherein the cyclic hydrocarbon compound is a substituted monocyclic compound, or an optionally substituted, bicyclic or fused-ring compound.

6. The upper film-forming composition according to claim 3, wherein the cyclic hydrocarbon compound is a C6-C19 cyclic hydrocarbon compound.

7. The composition according to claim 1, wherein the unit structure derived from a maleimide structure is represented by formula (1):

[Chem. 1]

formula (1)

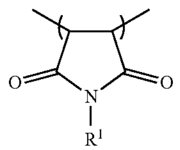

(in formula (1), $R^1$ denotes a hydrogen atom, a C1-C10 linear, branched or cyclic alkyl group, or a C6-C10 aryl group optionally substituted with halogen).

8. The composition according to claim 1, wherein the unit structure derived from a styrene structure is represented by formula (2):

[Chem. 2]

formula (2)

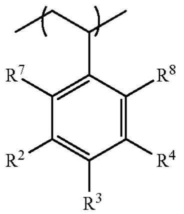

(in formula (2), $R^2$ to $R^4$, $R^7$ and $R^8$ each independently denote a hydrogen atom, a C1-C5 alkoxy group, or a C1-C10 linear, branched or cyclic alkyl group optionally substituted with halogen).

9. The composition according to claim 1, wherein copolymer (A) further comprises:

(b) a unit structure derived from a (meth)acrylic group.

10. The composition according to claim 9, wherein the unit structure derived from a (meth)acrylic group is represented by formula (3):

[Chem. 3]

formula (3)

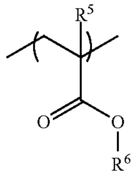

(in formula (3), $R^5$ and $R^6$ each independently denote a hydrogen atom, a C1-C5 alkoxy group, or a C1-C10 linear, branched or cyclic alkyl group optionally substituted with halogen).

11. The composition according to claim 1, wherein copolymer (A) is a copolymer obtained by copolymerizing a monomer mixture comprising a compound represented by formula (4):

[Chem. 4]

formula (4)

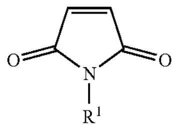

(in formula (4), $R^1$ denotes a hydrogen atom, a C1-C10 linear, branched or cyclic alkyl group, or a C6-C10 aryl group optionally substituted with halogen), and a compound represented by formula (5):

[Chem. 5]

formula (5)

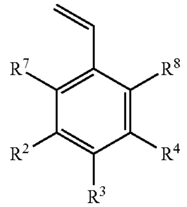

(in formula (5), $R^2$ to $R^4$, $R^7$ and $R^8$ each independently denote a hydrogen atom, a C1-C5 alkoxy group, or a C1-C10 linear, branched or cyclic alkyl group optionally substituted with halogen).

12. A method for forming a phase-separated pattern in a block copolymer, the method comprising the steps of:

(1) forming a block copolymer layer on a substrate;

(2) forming, on the block copolymer layer, an upper film using the composition according to claim 1; and (3) inducing phase-separation of the block copolymer layer formed on the substrate.

13. A method for producing a pattern, comprising the steps of:

(1) forming a block copolymer layer on a substrate;

(2) forming, on the block copolymer layer, an upper film using the composition according to claim 1;

(3) inducing phase-separation of the block copolymer layer formed on the substrate; and (4) etching the phase-separated block copolymer layer.

14. A method for manufacturing a semiconductor device, comprising the steps of:

(1) forming a block copolymer layer on a substrate;

(2) forming, on the block copolymer layer, an upper film using the composition according to claim 1;

(3) inducing phase-separation of the block copolymer layer formed on the substrate; and (4) etching the phase-separated block copolymer layer;

(5) etching the substrate.

* * * * *